United States Patent
St. Rock et al.

(10) Patent No.: US 10,222,102 B2
(45) Date of Patent: Mar. 5, 2019

(54) THERMOELECTRIC BASED HEAT PUMP CONFIGURATION

(71) Applicant: AMI Industries, Inc., Colorado Springs, CO (US)

(72) Inventors: Brian St. Rock, Andover, CT (US); Eric S. Landry, West Hartford, CT (US)

(73) Assignee: AMI INDUSTRIES, INC., Colorado Springs, CO (US)

( * ) Notice: Subject to any disclaimer, the term of this patent is extended or adjusted under 35 U.S.C. 154(b) by 0 days.

(21) Appl. No.: 15/937,898

(22) Filed: Mar. 28, 2018

(65) Prior Publication Data

US 2018/0216855 A1 Aug. 2, 2018

Related U.S. Application Data (62) Division of application No. 14/919,495, filed on Oct. 21, 2015.

(51) Int. Cl.
| | |
|---|---|
| *H05K 7/20* | (2006.01) |
| *F25B 21/02* | (2006.01) |
| *F25B 21/04* | (2006.01) |
| *H01L 23/467* | (2006.01) |

(52) U.S. Cl.
CPC ............ *F25B 21/02* (2013.01); *F25B 21/04* (2013.01); *H05K 7/2029* (2013.01); *H05K 7/20136* (2013.01); *F25B 2321/023* (2013.01); *F25B 2321/0211* (2013.01);

(Continued)

(58) Field of Classification Search
CPC ............... H05K 7/20136; F25B 21/02; F25B 2321/023; F25B 21/04
See application file for complete search history.

(56) References Cited

U.S. PATENT DOCUMENTS

| | | |
|---|---|---|
| 6,651,445 B1 | 11/2003 | Clark |
| 6,779,348 B2 | 8/2004 | Taban |
| 7,836,704 B2 | 11/2010 | Lee |

(Continued)

FOREIGN PATENT DOCUMENTS

| | | |
|---|---|---|
| JP | H07234035 A | 9/1995 |
| WO | 1999061269 A2 | 12/1999 |
| WO | 2015107899 A1 | 7/2015 |

OTHER PUBLICATIONS

European Search Report for EP Application No. 16194981.3 dated Feb. 24, 2007; 8 pages.

(Continued)

*Primary Examiner* — Ana M Vazquez
(74) *Attorney, Agent, or Firm* — Cantor Colburn LLP (57) ABSTRACT

A heat exchange system for exchanging heat with an object may include a centrifugal blower for directing air flow in a downward and an outward direction, a heat sink base positioned to receive the air flow from the centrifugal blower, a diffuser on the heat sink base and in the path of the air flow from the centrifugal blower, the diffuser having vanes that are in thermal communication with the heat sink base that direct the air flow from the blower outward over the heat sink base, and a thermoelectric device having a low temperature side and a high temperature side, where the thermoelectric device is in thermal communication with the heat sink base on the low temperature side and the high temperature side.

6 Claims, 6 Drawing Sheets

(52) U.S. Cl.
CPC ............. *F25B 2321/0212* (2013.01); *F25B 2321/0251* (2013.01); *F25B 2321/0252* (2013.01); *H01L 23/467* (2013.01)

(56) References Cited

U.S. PATENT DOCUMENTS

| | | |
|---|---|---|
| 7,866,164 B2 | 1/2011 | Rice |
| 8,096,136 B2 | 1/2012 | Zheng et al. |
| 8,964,388 B2 | 2/2015 | Turney et al. |
| 9,084,397 B2 | 7/2015 | Smith |
| 2002/0162339 A1 | 11/2002 | Harrison |
| 2003/0024565 A1 | 2/2003 | Guy |
| 2005/0257532 A1* | 11/2005 | Ikeda .............. F25B 21/02 62/3.7 |
| 2008/0105213 A1 | 5/2008 | Chen |
| 2010/0170657 A1 | 7/2010 | Kaslusky |
| 2011/0061400 A1 | 3/2011 | Park |
| 2012/0047911 A1 | 3/2012 | Bhavsar |
| 2013/0048045 A1 | 2/2013 | Bayer |
| 2014/0318152 A1 | 10/2014 | Ghoshal et al. |

OTHER PUBLICATIONS

Kandasamy et al., "Transient Cooling of Electronics Using Phase Change Material (PCM)-based Heat Sinks", Applied Therman Engineering, Pergamon, Oxford, GB, vol. 28, No. 8-9, Mar. 1, 2008, pp. 1047-1057.

* cited by examiner

THERMOELECTRIC BASED HEAT PUMP CONFIGURATION

DOMESTIC PRIORITY

This application is a divisional of U.S. patent application Ser. No. 14/919,495 filed Oct. 21, 2015, the disclosure of which is incorporated by reference herein in its entirety.

BACKGROUND OF THE INVENTION

The present disclosure relates to a thermoelectric-based heat pump, and more particularly, to configurations for thermoelectric-based heat pumps.

Because of the increased power consumption of electronic technologies, heat rejection systems have grown in size, weight, complexity and cost. In some instances, conventional air-cooled heat sinks have become inadequate. This has resulted in systems with exotic liquid-cooled manifolds, spray-cooled enclosures, and vapor-compression refrigeration being proposed. These approaches may add complexity associated with operation and maintenance of active pumps and compressors, and introduce opportunities for fluid or vapor leakage. Conventional designs may include high heat transfer impingement rows generated by axial fans placed above the heat sink. Small-scale (under 100 W) cooling systems often rely on vapor compression cycles or forced convection of unconditioned air. These types of systems may be limited in application due to their effective range of ambient conditions and/or bulky weight and size.

SUMMARY OF THE INVENTION

According to one embodiment, a heat exchange system for exchanging heat with an object may include a centrifugal blower for directing air flow in a downward and an outward direction, a heat sink base positioned to receive the air flow from the centrifugal blower, a diffuser on the heat sink base and in the path of the air flow from the centrifugal blower, the diffuser having vanes that are in thermal communication with the heat sink base that direct the air flow from the blower outward over the heat sink base, and a thermoelectric device having a low temperature side and a high temperature side, where the thermoelectric device is in thermal communication with the heat sink base on the low temperature side and the high temperature side.

According to another embodiment, a method for exchanging heat with an object may include directing an air flow through a first centrifugal blower in a downward and an outward direction, directing the air flow from the first centrifugal blower outward over a first heat sink base via a first diffuser on the heat sink base and in a path of the air flow from the blower, the diffuser having vanes that are in thermal communication with the heat sink base, receiving heat from the air flow via the first heat sink base, and exchanging heat with the object via a thermoelectric device having a low temperature side and a high temperature side, where the thermoelectric device is in thermal communication with the heat sink base.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
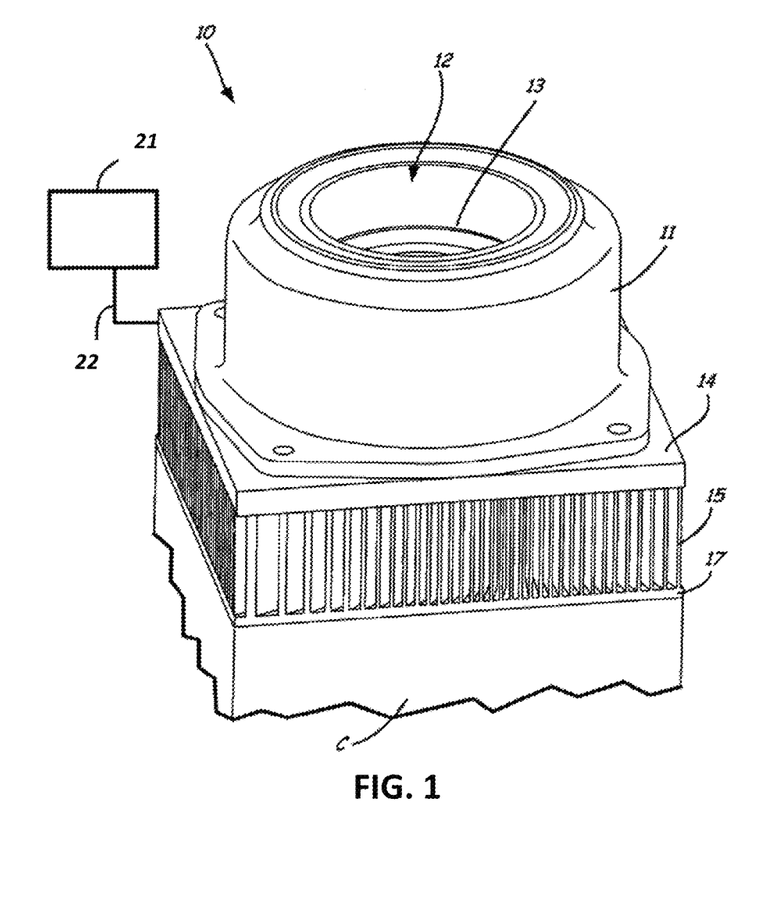
FIG. 1 depicts a perspective view of a compact heat sink with integrated blower.

Air cooling system 10 for cooling component C is shown in FIG. 1. System 10 may include motor 11, blower 13, cover 14, diffuser 15 and heat sink base 17. The heat sink base 17 may be an integral part of system 10, or it may be part of component C being cooled. In FIG. 1, the diffuser 15 can also function with heat sink base 17 as part of a heat sink. The motor 11 and blower 13 can be integral and may be mounted on cover 14, which may serve as the top of the diffuser 15 and supports all of the elements between cover 14 and heat sink base 17. System 10 can heat and/or cool objects it is in thermal communication with another device, such as a device shown generically as component C. Any object generating heat can be cooled by system 10 if it can be placed in thermal communication therewith. Similarly, in some embodiments, system 10 may transfer heat from system 10 to heat component C.

Motor 11 is depicted as a toroidal electric motor having a central airway 12 around its rotational axis. Air can be drawn by rotation of blower 13 axially down through central airway 12 into blower 13 and then into diffuser 15. Air may flow outward or inward with respect to blower 13. Other motors may also be used, with different configurations and sources of power, and/or similar configurations and sources of power. Controller 21 can provide a source of energy via line 22 to drive motor 11 and other active components described below. In operation, motor 11 may cause air to be drawn into central airway 12 by blower 13, passing through a central aperture in cover 14 into diffuser 15. The air can flow through diffuser 15 and contact heat sink base 17 to cool component C. Airflow through diffuser 15 can be radial, spiral or diffuser 15 can be configured for other paths.

Figure 2:
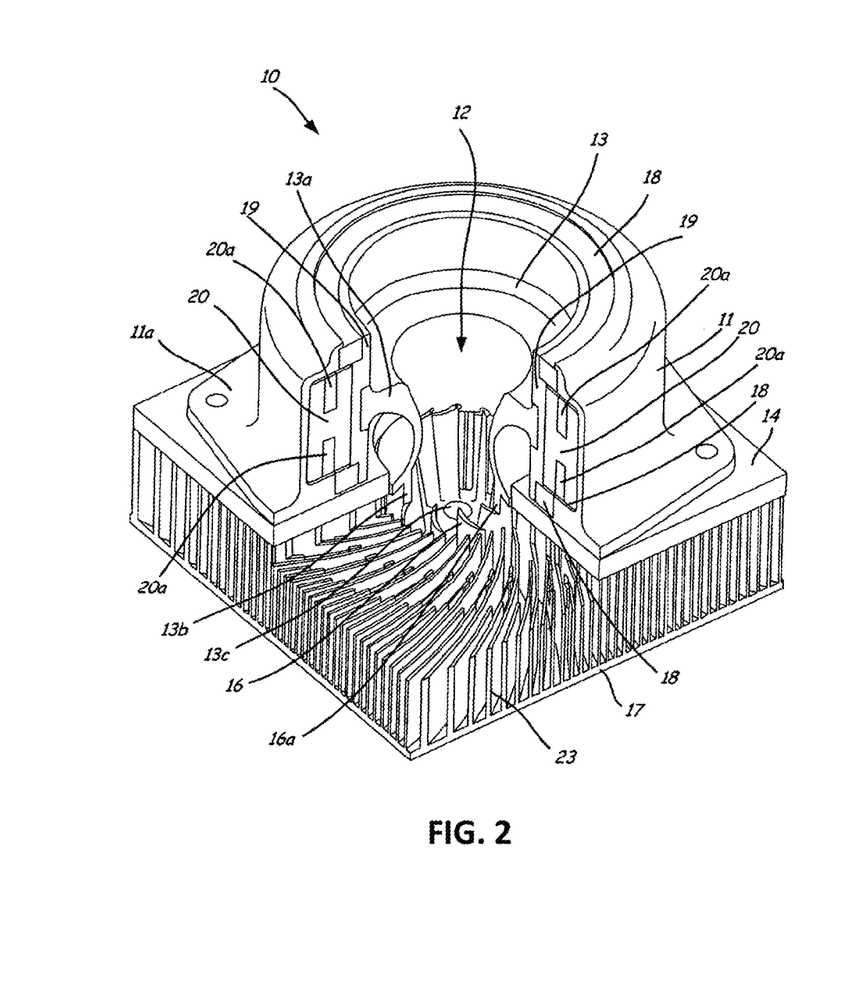
FIG. 2 depicts a partial cutaway of the device depicted in FIG. 1.

As seen in FIG. 2, the internal components of system 10 are shown. Motor 11 can include a housing 11a, bearings 18, permanent magnet rotor 19, stator 20, and stator windings 20a to support rotation of the rotor 19 and blower 13. Stator windings 20a may be positioned to receive electrical power from controller 21 and drive the blower 13 in a normal electric motor fashion.

Blower 13 may have an upper hub 13a, a lower hub 13b and blades 16. Upper hub 13a can be connected to the permanent magnet rotor 19. Blades 16 may have an upper end 16a connected to lower hub 13b. A center port 130 in lower hub 13b may provide a passage for air flow through lower hub 13b and into space between lower hub 13b and heat sink base 17.

Diffuser 15 may include a plurality of fins or vanes 23 and other elements shown and described below that take air from central passage 12 so that air contacts the vanes 23 and the heat sink base 17 to absorb heat into the air and out of system 10. Diffuser 15 may serve two purposes in this device. First, diffuser 15 may detect the flow of air from a vertically downward direction radially outward as will be described below. Second, the diffuser vanes 23 may provide additional heat conductive material as part of the heat sink 17, so that more hot metal is exposed to the cooling air flow. Motor 11, blower 13, diffuser 15 and heat sink 17 can attached together to form a single device that can be attached to an electronic package such as a circuit board in the same manner that conventional air-cooled heat-exchangers may be attached.

Figure 3:
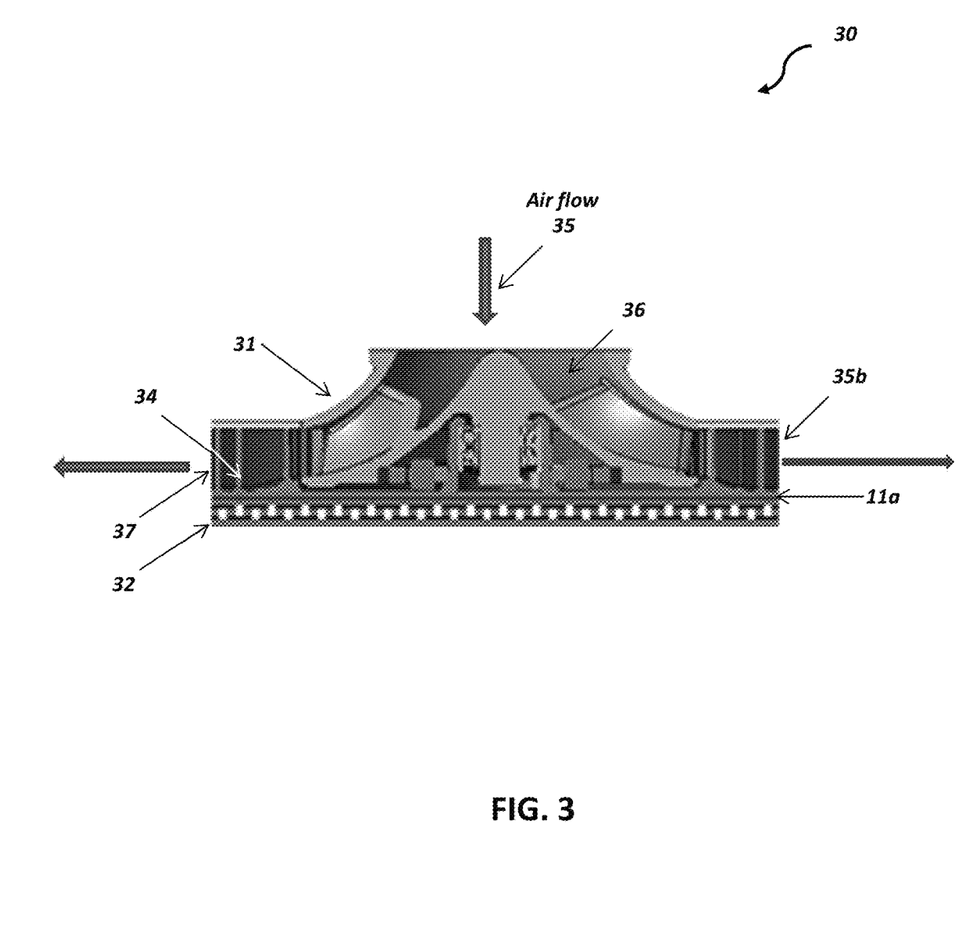
FIG. 3 depicts a thermoelectric-based heat exchanger.

It may be advantageous to provide devices for enabling lightweight and compact heat exchange having an optimized rate of heat exchange while providing fewer mechanical parts and operative fluids that may break, leak, etc. As depicted in FIG. 3, according to some embodiments, a thermoelectric heat exchange unit 30 may be configured to cool a device or surface in contact with a thermoelectric module 32. Thermoelectric module 32 may be sandwiched between the device or surface being cooled and a compact air cooling system 31. Heat exchanger 31 may be substantially similar to air cooling system 10, but with fins (diffuser vanes) 34 and motor configuration tailored for the specific application. Heat removed from the device being cooled and waste heat produced by the device is rejected to input air 35 within air cooling system 31 and exhausted to the surroundings via hot exhaust port 37. In some aspects, thermoelectric heat exchange unit 30 may be optimized to maximize heat transfer between component input air 35 and thermoelectric module 32.

Figure 4:
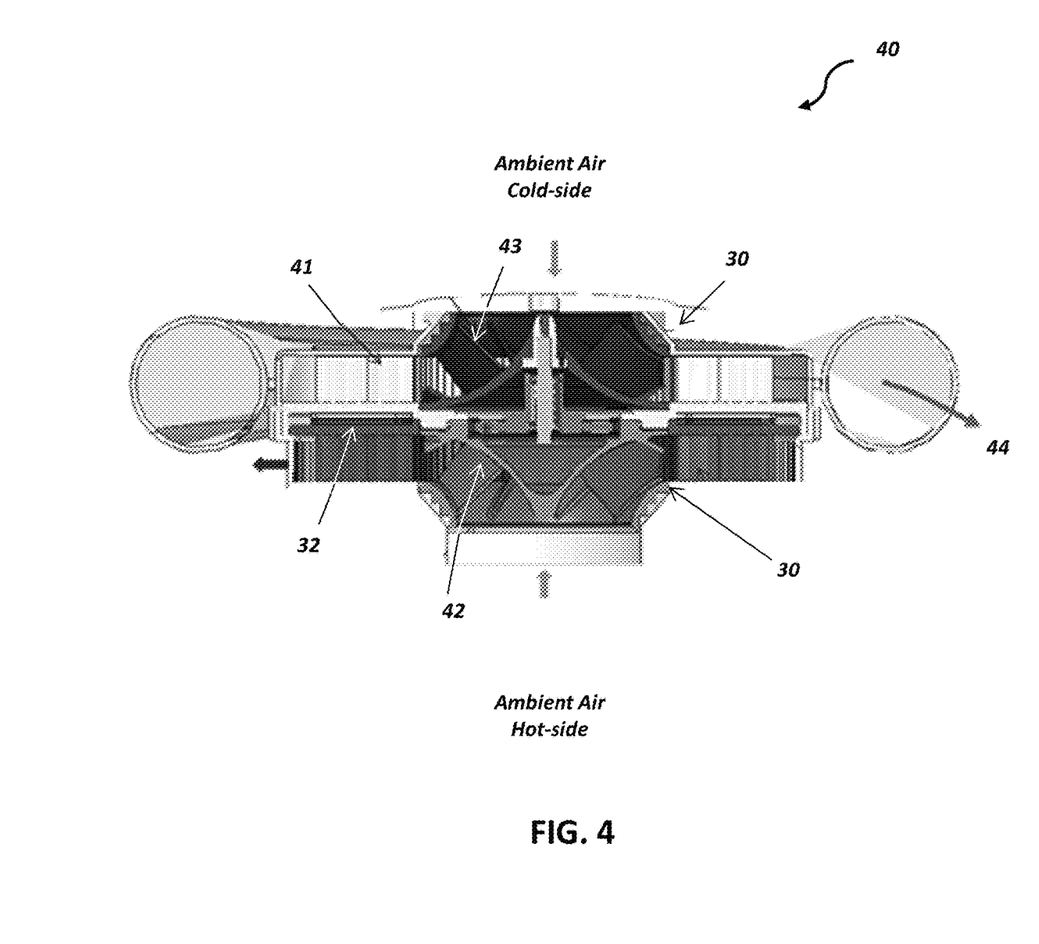
FIG. 4 depicts a chilled air thermoelectric cooling unit.

Referring now to FIG. 4, in some embodiments, a chilled air thermoelectric heat exchange unit (40) may include two air cooling units 31 to generate a chilled air stream. In this configuration, a thermoelectric module 32 may be configured between the two air cooling units 31 Air may be drawn into each air cooling unit and heat can be pumped from one air stream to the other using the thermoelectric module, producing a chilled air stream and a heated air stream. The side of the device with the cooled air stream and the side of the device having the heated air stream can be configured based on the polarity of the voltage applied to the thermoelectric module. The chilled and/or heated exhaust air may be collected in a volute as shown. The volute may comprise a plurality of configurations, including a single exhaust port, or multiple exhaust ports.

According to some embodiments, hot-side blower 42 and cold-side blower 43 may rotate at the same speed. In other embodiments, the hot-side blower 42 may blow may rotate at a different speed than cold-side blower 43. In some aspects, each of the blowers 42 and 43 may be either constant or variable speed.

In other embodiments, a volute (not shown) may be configured with thermoelectric heat pump unit 40 to capture chilled air 44. The volute may comprise a plurality of configurations, including a single exhaust port, or multiple exhaust ports as needed for air distribution In some embodiments, a heat spreader (not shown) may be incorporated between thermoelectric module 32 and the air cooling units 31 to improve thermal performance or allow the thermoelectric module 32 to have a surface area than the air cooling units 31.

In some embodiments, the inlet air into each side of the device may come from the same source. In other embodiments, the inlet air may come from different sources.

In some embodiments, chilled air devices may operate in a low power consumption mode, where heat load may be managed by forced convection of unconditioned air. Accordingly, thermoelectric module 32 and the hot-side heat exchanger may be unpowered while air is circulated to the system being cold using the source side device.

Figure 5:
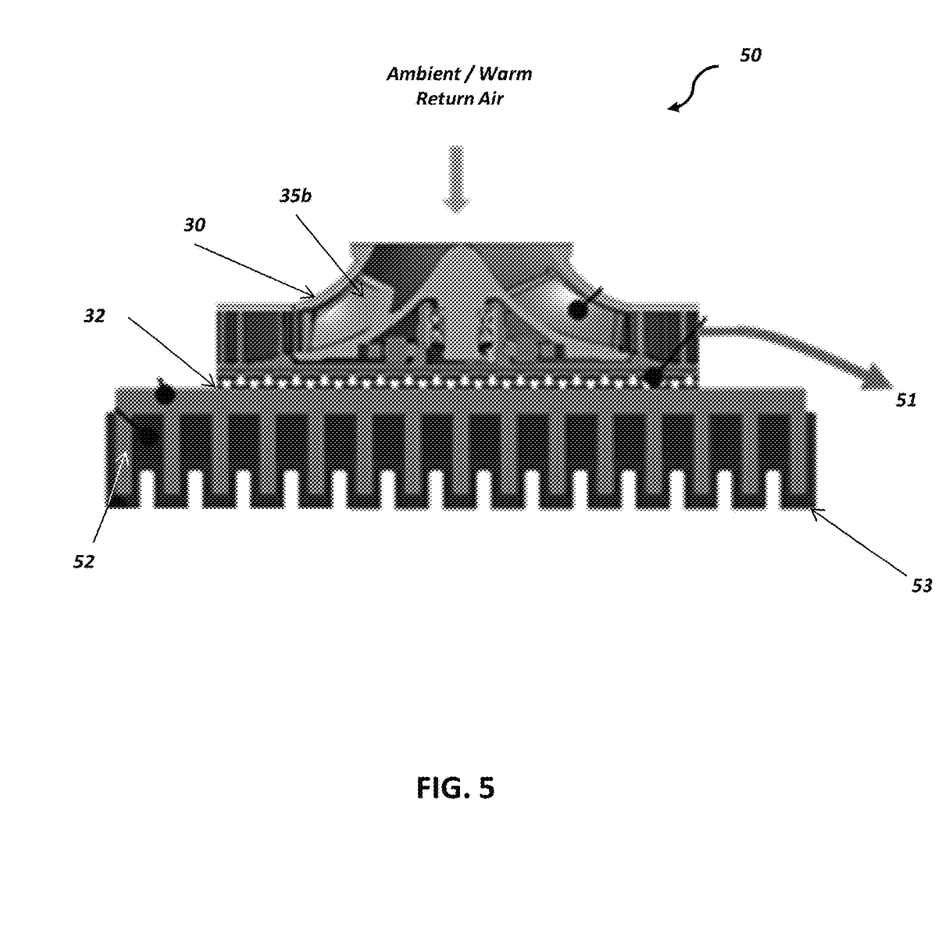
FIG. 5 depicts a chilled air thermoelectric cooling unit with thermal storage.

Referring now to FIG. 5, a chilled air thermoelectric heat exchange unit with thermal storage 50 is depicted, in accordance with some embodiments. In this configuration, heat can be pumped from the air stream entering air cooling system 31 to a heat sink 52 using a thermoelectric module 32, producing a chilled air stream 51 that can be collected in a volute (not shown) with one or more outlet ports. The heat removed from the air stream and waste heat produced by the thermoelectric module is rejected via the heat sink 52 to a phase change material. This heat may be ultimately rejected to ambient via heat sink 52. In some aspects, this configuration may supply cooling for short periods without requiring significant heat rejection to the surroundings and can accommodate temporary increases in heat load without requiring the system to be oversized for peak cooling loads. Chilled air thermoelectric heat exchange unit 50 may also operate in an open system or a closed system.

Figure 6:
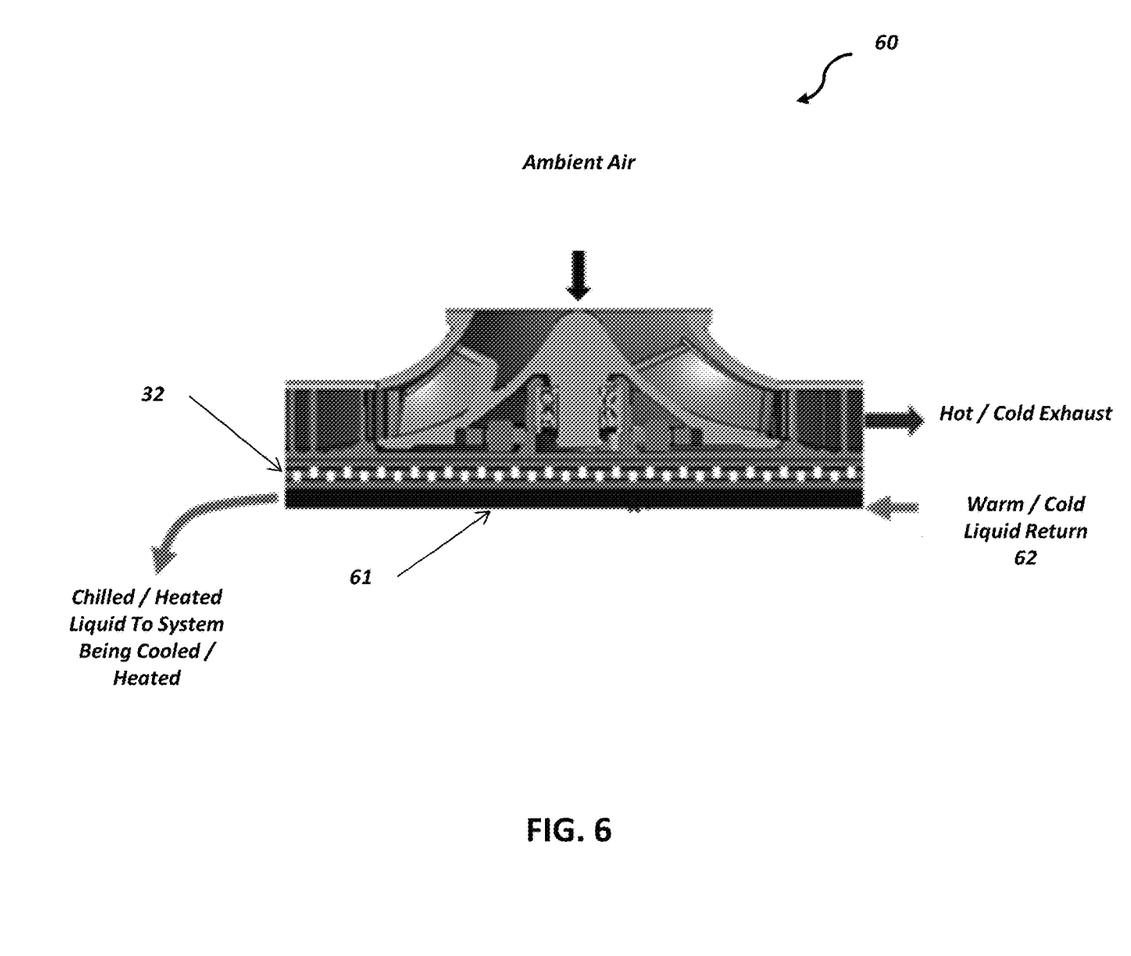
FIG. 6 depicts a chilled liquid thermoelectric cooling unit.

Referring now to FIG. 6, a chilled liquid thermoelectric heat exchange unit 60 is depicted according to some embodiments. Heat exchange unit 60 may include a cold plate 61 attached to the thermoelectric heat exchanger 30. Heat is pumped from the liquid in cold plate 61 to the air cooling system 31 using a thermoelectric module 32, producing a cooled liquid stream. In other embodiments, the polarity of the voltage applied to the thermoelectric device may be reversed in order to produce a warm liquid stream.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention.

Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A heat exchange system for exchanging heat with an object comprising:
    a first air cooling unit, the first air cooling unit including:
        a first centrifugal blower for directing air flow in a downward and an outward direction;
        a first heat sink base positioned to receive the air flow from the first centrifugal blower; and
        a first diffuser on the first heat sink base and in a path of the air flow out of the first centrifugal blower, the first diffuser having vanes that are in thermal communication with the first heat sink base that direct the air flow from the blower outward over the first heat sink base;

a second air cooling unit, the first air cooling unit including:
   a second centrifugal blower for directing the air flow in an upward and outward direction with respect to the second centrifugal blower;
   a second heat sink base in thermal communication with the second centrifugal blower, the second heat sink base positioned to receive the air flow from the second centrifugal blower; and
   a second diffuser on the second heat sink base and in a path of the air flow out of the second centrifugal blower, the second diffuser having vanes that are in thermal communication with the second heat sink base that direct the air flow from the second blower outward over the second heat sink base; and
a thermoelectric device having a low temperature side and a high temperature side, wherein the thermoelectric device is in thermal communication with the first heat sink base on the low temperature side and the second heat sink base on the high temperature side.

2. The heat exchange system of claim 1, wherein the first and second centrifugal blowers operate at the same speed.

3. The heat exchange system of claim 1, further comprising:
   a heat spreader disposed between the thermoelectric device and one of the first heat sink base and the second heat sink base.

4. The heat exchange system of claim 1, wherein inlet air directed into the first and second air cooling units is received from the same source.

5. The heat exchange system of claim 1, wherein when the system operates in a in a low power consumption mode one or more of the blowers and the thermoelectric device are be unpowered.

6. The heat exchange system of claim 1, wherein the first and second centrifugal blowers rotate at different speeds.

* * * * *